(12) United States Patent
Wu (10) Patent No.: US 12,196,629 B2
(45) Date of Patent: Jan. 14, 2025

(54) MEASURING DEVICE AND OPTICAL FIBER STRAIN MEASURING JIG THEREOF

(71) Applicant: TOKYO ELECTRON LIMITED, Tokyo (JP)

(72) Inventor: Tong Wu, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 305 days.

(21) Appl. No.: 17/586,443

(22) Filed: Jan. 27, 2022

(65) Prior Publication Data

US 2022/0244115 A1 Aug. 4, 2022

(30) Foreign Application Priority Data

Jan. 29, 2021 (JP) ................................. 2021-012651

(51) Int. Cl.
*G01L 1/24* (2006.01)
*G01K 11/32* (2021.01)
*H01J 37/32* (2006.01)
*H01L 21/683* (2006.01)

(52) U.S. Cl.
CPC .............. *G01L 1/242* (2013.01); *G01K 11/32* (2013.01); *H01J 37/32715* (2013.01); *H01L 21/6831* (2013.01); *H01J 2237/2007* (2013.01); *H01J 2237/2445* (2013.01); *H01J 2237/24585* (2013.01)

(58) Field of Classification Search
None
See application file for complete search history.

(56) References Cited

U.S. PATENT DOCUMENTS

| 10,209,060 | B1* | 2/2019 | Nguyen | ................ | G01B 11/18 |
| 2012/0099097 | A1* | 4/2012 | Coupe | ................... | G01B 11/06 |
| | | | | | 356/32 |
| 2015/0285705 | A1* | 10/2015 | Kumar | ................ | G01M 5/0033 |
| | | | | | 356/73.1 |
| 2016/0116366 | A1* | 4/2016 | Da Silva | ................. | G01M 7/00 |
| | | | | | 73/579 |
| 2019/0006157 | A1 | 1/2019 | O'Banion et al. | | |
| 2020/0340871 | A1* | 10/2020 | Kwon | .................... | G01N 29/44 |

FOREIGN PATENT DOCUMENTS

| JP | 2000221085 | * | 8/2000 |
| JP | 2000221085 | A | 8/2000 |
| JP | 2004-31594 | A | 1/2004 |
| JP | 2005091151 | A | 4/2005 |
| JP | 2015527600 | * | 9/2015 |

* cited by examiner

*Primary Examiner* — Brandi N Hopkins
*Assistant Examiner* — Nigel H Plumb
(74) *Attorney, Agent, or Firm* — Nath, Goldberg & Meyer; Jerald L. Meyer; Tanya E. Harkins (57) ABSTRACT

A measuring device and an optical fiber strain measuring jig thereof appropriately measure an attraction force distribution on a wafer held by an electrostatic chuck. The measuring jig includes a substrate configured to be held by the electrostatic chuck; and an optical fiber including therein reflection elements capable of reflecting light having a wavelength corresponding to strain of the substrate due to stress, and fixed to one surface of the substrate in a state in which the reflection elements are disposed at plural positions, respectively, on the one surface of the substrate.

13 Claims, 4 Drawing Sheets

MEASURING DEVICE AND OPTICAL FIBER STRAIN MEASURING JIG THEREOF

CROSS-REFERENCE TO RELATED APPLICATION

This application is based upon and claims the benefit of priority from Japanese Patent Application No. 2021-012651, filed on Jan. 29, 2021, the entire contents of which are incorporated herein by reference.

TECHNICAL FIELD

The present disclosure relates to a measuring jig and a measuring device.

BACKGROUND

In a semiconductor manufacturing apparatus, when a process such as etching or film formation is performed on a wafer, the wafer is held by an electrostatic chuck disposed in a chamber (see, for example, Patent Document 1).

PRIOR ART DOCUMENT

Patent Document

Patent Document 1: Japanese Laid-Open Patent Publication No. 2004-31594

SUMMARY

According to one embodiment of the present disclosure, there is provided a measuring jig. The measuring jig includes a substrate having substantially the same shape as a wafer for semiconductor manufacturing; and an optical fiber including therein reflection elements capable of reflecting light having a wavelength corresponding to strain of the substrate due to stress, and fixed to one surface of the substrate in a state in which the reflection elements are disposed at plural positions, respectively, on the one surface of the substrate.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of a measuring jig and a measuring device disclosed in the present application will be described in detail with reference to the drawings. The disclosed measuring jig and measuring device are not limited by the present embodiment.

When an attraction force distribution on a wafer held by an electrostatic chuck is nonuniform, the temperature distribution on the wafer becomes nonuniform, and thus processing characteristics of etching, film formation, or the like change. When the attraction force distribution on a wafer is increased as a whole or locally, the attraction surface of the electrostatic chuck may be scraped by the wafer and particles may be generated. Therefore, it is desired that an attraction force distribution on a wafer held by an electrostatic chuck is appropriately measured.

[Configuration of Measuring Device]

A measuring device according to an embodiment is a device for measuring an attraction force distribution on a wafer held by the electrostatic chuck arranged in a chamber of a semiconductor manufacturing apparatus. The semiconductor manufacturing apparatus is, for example, a plasma processing apparatus that performs a process such as etching or film formation using plasma. The electrostatic chuck is disposed, for example, in a chamber in which plasma processing of the plasma processing apparatus is performed. The measuring device according to an embodiment uses a measuring jig in which an optical fiber including therein reflection elements capable of reflecting light having a wavelength corresponding to the strain of a measurement target due to stress is fixed on a substrate that simulates a wafer. The measuring device measures an attraction force distribution on the wafer by emitting light to the optical fiber in a state in which the measuring jig is held by the electrostatic chuck, and calculating the strain amount of the substrate at positions based on the light reflected by the reflection elements.

Figure 1:
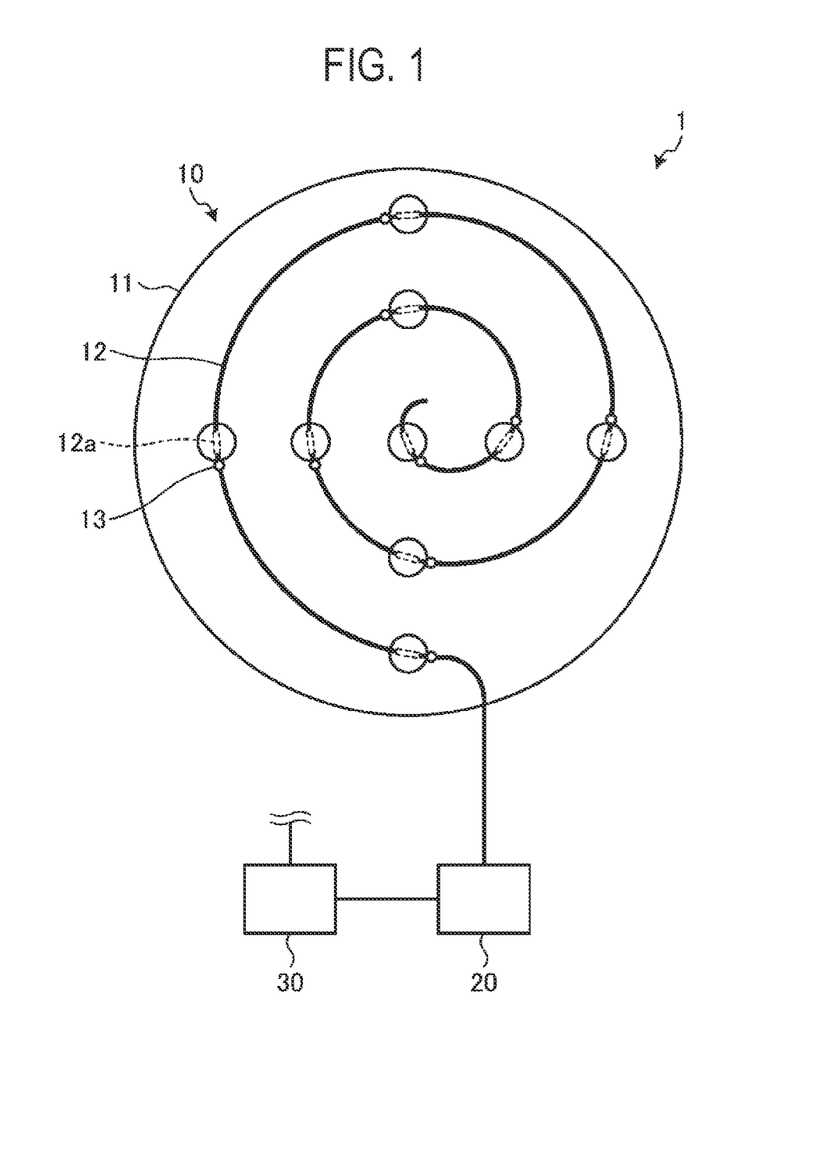
FIG. 1 is a top view illustrating a configuration example of a measuring device according to an embodiment.

FIG. 1 is a top view illustrating a configuration example of a measuring device 1 according to an embodiment. As illustrated in FIG. 1, the measuring device 1 includes a measuring jig 10, a measuring instrument 20, and a recorder 30.

The measuring jig 10 includes a substrate 11 having substantially the same shape as a wafer for semiconductor manufacturing, an optical fiber 12 fixed on the top surface of the substrate 11, and a temperature sensor 13 provided on the top surface of the substrate 11.

The substrate 11 is a substrate that simulates a wafer that is held by an electrostatic chuck disposed in a chamber of a semiconductor manufacturing apparatus. The shape of the substrate 11 has substantially the same shape as a wafer for semiconductor manufacturing, and has, for example, a disk shape having a thickness of about 775 μm and a diameter of about 300 mm. The substrate 11 may have a dimension other than the above dimensions. As the material for forming the substrate 11, for example, silicon, a resin having higher flexibility than silicon, or the like may be used.

The optical fiber 12 includes therein fiber Bragg gratings (FBGs) 12a. Each FBG 12a has a higher refractive index than the refractive index of a portion of the optical fiber 12 in which the FBGs 12a are not formed. Each FBG 12a can selectively reflect light having a wavelength corresponding to the strain of the substrate 11 due to stress with a predetermined reflectance. In each FBG 12a, the wavelength of the reflected light (hereinafter, appropriately referred to as a "reflected wavelength") changes depending on a change in stress applied from the substrate 11. That is, each FBG 12a can detect the amount of change in the reflected wavelength as the strain amount of the substrate 11. The optical fiber 12 reflects the light output from the measuring instrument 20 to the optical fiber 12 by the FBGs 12a, and transmits the light to the measuring instrument 20 as light for measuring the strain of the substrate 11 due to the stress. The FBGs 12a are an example of reflection elements.

The optical fiber 12 is fixed on the top surface of the substrate 11 in a state in which the FBGs 12a are disposed at plural positions, respectively, on the top surface of the substrate 11. For example, as illustrated in FIG. 1, the optical fiber 12 is fixed on the top surface of the substrate 11 such that the FBGs 12a are disposed at spirally arranged positions, respectively, from the center of the substrate 11 toward the peripheral edge on the top surface of the substrate 11.

In this way, by fixing the optical fiber 12 on the top surface of the substrate 11 in the state in which the FBGs 12a are arranged at the plural positions, respectively, on the top surface of the substrate 11, it is possible to calculate the strain amount of the substrate 11 at the plural positions in the measuring instrument 20. Therefore, the measuring device 1 according to the embodiment can appropriately measure an attraction force distribution on the wafer and held by the electrostatic chuck.

The temperature sensor 13 is provided on the top surface of the substrate 11 adjacent to each FBG 12a. The temperature sensor 13 detects the temperature of the substrate 11 at each of the plural positions at which the FBGs 12a are respectively disposed. The temperature sensor 13 is connected to the recorder 30, and the temperature of the substrate 11 detected by the temperature sensor 13 is recorded in the recorder 30. The temperature of the substrate 11 recorded in the recorder 30 is used to compensate for the strain amount of the substrate 11 calculated by the measuring instrument 20. In a case where the temperature of the substrate 11 can be considered to be uniform as a whole, one temperature sensor 13 may be provided at an arbitrary position on the top surface of the substrate 11.

Figure 2:
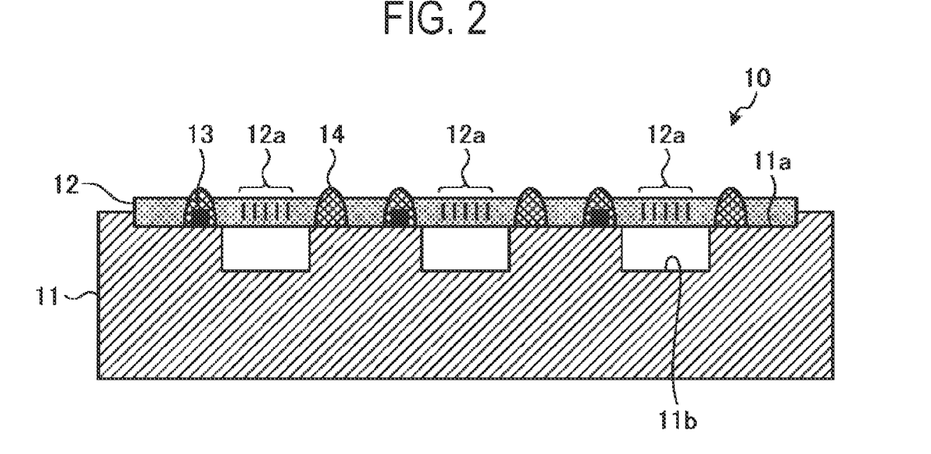
FIG. 2 is a schematic cross-sectional view illustrating a measuring jig according to an embodiment.

Here, the configuration on the top surface of the substrate 11 will be described with reference to FIG. 2. FIG. 2 is a schematic cross-sectional view illustrating the measuring jig 10 according to an embodiment. FIG. 2 schematically illustrates a cross-section of the substrate 11 and the optical fiber 12 along the longitudinal direction of the optical fiber 12. As illustrated in FIG. 2, the optical fiber 12 is fixed on the top surface of the substrate 11. Inside the optical fiber 12, the FBGs 12a are formed at predetermined intervals in the longitudinal direction of the optical fiber 12. The optical fiber 12 is disposed in a groove portion 11a formed in a spiral shape on the top surface of the substrate 11, and is bonded at positions, where each FBG 12a is interposed therebetween, on the top surface of the substrate 11 by an adhesive 14.

The FBGs 12a are disposed at plural positions, respectively, on the top surface of the substrate 11. Specifically, recesses 11b arranged in a spiral shape are formed on the top surface of the substrate 11, and the FBGs 12a are disposed at the positions of the recesses 11b, respectively, to be spaced apart from the bottom surfaces of the recesses 11b. By spacing the FBGs 12a away from the bottom surfaces of the recesses 11b, a change in the refractive index of each FBG 12a according to the temperature change of the substrate 11 is suppressed, and the amount of change of the reflected wavelength of each FBG 12a detected as the strain amount of the substrate 11 is less likely to be affected by the temperature change of the substrate 11. As a result, the accuracy of detecting the strain amount of the substrate 11 in each FBG 12a can be improved.

In addition, a temperature sensor 13 is provided adjacent to each FBG 12a on the top surface of the substrate 11. The temperature sensor 13 is bonded at one of the positions, where each FBG 12a is interposed therebetween, on the top surface of the substrate 11 by an adhesive 14 that bonds the optical fiber 12. This makes it possible to measure the temperature of the substrate 11 used for compensating for the strain amount of the substrate 11 with high accuracy by the temperature sensor 13. The temperature sensor 13 may be installed at any position as long as it is located adjacent to each FBG 12a. For example, the temperature sensor 13 may be provided on the bottom surface of each recess 11b corresponding to each FBG 12a.

A description will be made referring back to FIG. 1. The measuring instrument 20 is connected to the optical fiber 12 of the measuring jig 10. In addition, the measuring instrument 20 is connected to the recorder 30 in a wired or wireless manner. The recorder 30 may be a memory device, a hard disk drive or solid state drive.

Figure 3:
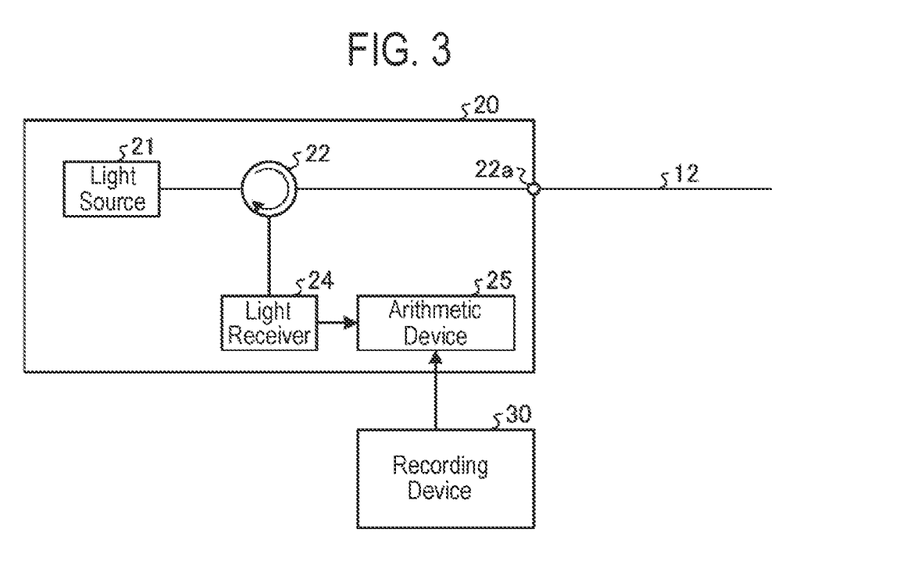
FIG. 3 is a block diagram illustrating an example of a measuring instrument according to an embodiment.

FIG. 3 is a block diagram illustrating an example of the measuring instrument 20 according to an embodiment. As illustrated in FIG. 3, the measuring instrument 20 includes a light source 21, a circulator 22, a light receiver 24, and an arithmetic device 25.

The light source 21 is, for example, a wavelength sweep type light source, and emits light of which the wavelength changes with time to the circulator 22. Specifically, the light source 21 emits light of which the wavelength changes with time to the circulator 22 in a state in which the measuring jig 10 is held by the electrostatic chuck disposed in the chamber of a semiconductor manufacturing apparatus.

The light emitted from the light source 21 to the circulator 22 is emitted to the optical fiber 12 via an input/output port 22a by the circulator 22. The light emitted from the light source 21 to the optical fiber 12 via the circulator 22 and the input/output port 22a is reflected by the FBGs 12a located inside the optical fiber 12 and transmitted to the measuring instrument 20 as reflected light. The reflected light input to the circulator 22 via the input/output port 22a is output to the light receiver 24 by the circulator 22.

The light receiver 24 is, for example, a photo diode (PD), which receives the reflected light output from the circulator 22 to the light receiver 24, generates light intensity data, and outputs the light intensity data to the arithmetic device 25. The light intensity data indicate intensities corresponding to plural wavelengths. The intensity corresponding to a certain wavelength among the intensities indicates the intensity of the reflected light of that wavelength among the reflected light received by the light receiver 24.

The arithmetic device 25 is, for example, a central processing unit (CPU) or a computer, and calculates strain amounts of the substrate 11 at plural positions on the top surface of the substrate 11 (that is, the positions at which the FBGs 12a are disposed) based on the light intensity data output from the light receiver 24. Specifically, the arithmetic device 25 calculates an amount of change of the wavelength of reflected light (i.e., the reflected wavelength of each FBG 12a) in the light intensity data when the measuring jig 10 is held by the electrostatic chuck, as a strain amount of the substrate 11. A strain amount can be converted into stress applied to a wafer, that is, an attraction force of a wafer, using the so-called Hooke's law. Therefore, strain amounts of the substrate 11 at the positions on the top surface of the substrate 11 indicate an attraction force distribution on the wafer that is held by an electrostatic chuck.

In the measuring jig 10, the reflected wavelength of each FBG 12a used for calculating the strain amount of the substrate 11 changes depending on the temperature change of the substrate 11. Therefore, there is a possibility that an error due to the temperature change of the substrate 11 may occur in the strain amount of the substrate 11 calculated by the arithmetic device 25.

Therefore, the arithmetic device 25 may compensate for the calculated strain amounts of the substrate 11 at the positions on the top surface of the substrate 11 (i.e., the positions at which the FBGs 12a are disposed) using the temperature of the substrate 11 recorded in the recorder 30. For example, the arithmetic device 25 holds in advance a correspondence relationship between a temperature of the substrate 11 and an error caused by a temperature change of the substrate 11. The arithmetic device 25 obtains an error based on the correspondence relationship and the temperature of the substrate 11 recorded in the recorder 30, and compensates for the calculated strain amount of the substrate 11 by subtracting the obtained error from the calculated strain amount of the substrate 11. This makes it possible for the measuring device 1 according to the embodiment to calculate the strain amount of the substrate 11 in which the error caused by the temperature change of the substrate 11 is canceled. Therefore, the attraction force distribution on the wafer held by the electrostatic chuck can be measured more appropriately.

[Method of Determining Abnormality of Electrostatic Chuck Using Measuring Device]

An abnormality of an electrostatic chuck may be determined using the above-described measuring device 1. Hereinafter, a method for determining an abnormality of an electrostatic chuck using the measuring device 1 will be described.

First, the measuring jig 10 is held by an electrostatic chuck having no abnormality (hereinafter referred to as a "reference electrostatic chuck"). Subsequently, in the state in which the measuring jig 10 is held by the reference electrostatic chuck, the measuring instrument 20 is controlled to calculate the strain amounts of the substrate 11 at plural positions on the top surface of the substrate 11.

Subsequently, the measuring jig 10 is held by an electrostatic chuck to be evaluated. Subsequently, in the state in which the measuring jig 10 is held by the electrostatic chuck to be evaluated, the measuring instrument 20 is controlled to calculate the strain amounts of the substrate 11 at plural positions on the top surface of the substrate 11.

Subsequently, it is determined whether or not the difference between the strain amounts of the substrate 11 calculated for the electrostatic chuck to be evaluated and the strain amounts of the substrate 11 calculated for the reference electrostatic chuck is within a predetermined allowable range. As a result of the determination, when the difference is not within the predetermined allowable range, it is determined that an abnormality has occurred in the electrostatic chuck to be evaluated.

According to such an abnormality determination method, an abnormality of the electrostatic chuck can be easily determined.

[Modification]

Next, a modification of the measuring device 1 according to the embodiment will be described with reference to FIG. 4. In the following description, the same reference numerals will be given to the configurations common to the above-described embodiments, and a detailed description thereof will be omitted.

Figure 4:
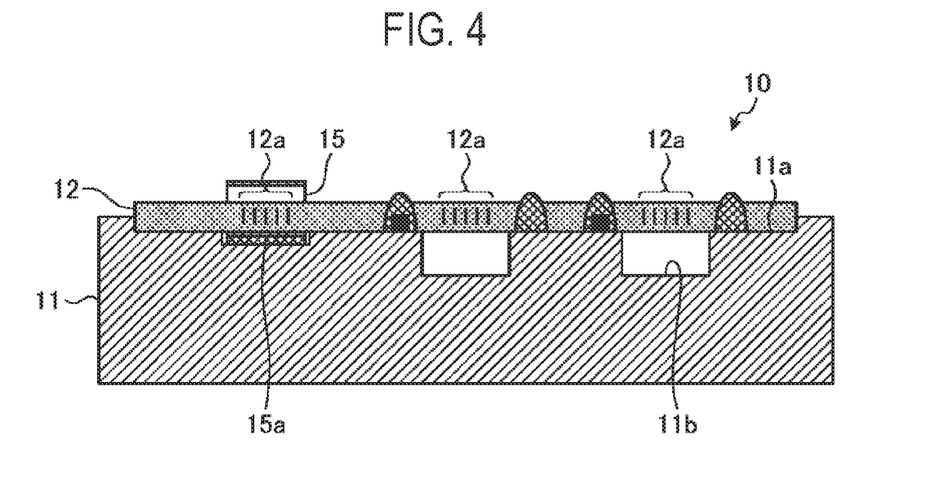
FIG. 4 is a schematic cross-sectional view illustrating a measuring jig according to a modification of the embodiment.

FIG. 4 is a schematic cross-sectional view illustrating a measuring jig 10 according to a modification of the embodiment. FIG. 4 schematically illustrates a cross-section of the substrate 11 and the optical fiber 12 along the longitudinal direction of the optical fiber 12. The measuring jig 10 illustrated in FIG. 4 is different from the measuring jig 10 illustrated in FIG. 2 in that one of FBGs is mainly used as a temperature sensor and a cover member is provided for the FBG used as the temperature sensor. For example, a case in which the FBG 12a located at the leftmost side of FIG. 4 is used as a temperature sensor among the FBGs 12a will be described. Hereinafter, the FBG 12a used as a temperature sensor will be referred to as an "FBG temperature sensor 12a".

The FBG temperature sensor 12a can selectively reflect light having a wavelength corresponding to the strain of a substrate 11 due to a temperature change with a predetermined reflectance. In the FBG temperature sensor 12a, the reflection wavelength changes depending on the temperature change of the substrate 11. That is, the FBG temperature sensor 12a can detect the amount of change in the reflection wavelength as the temperature of the substrate 11. The optical fiber 12 reflects the light output from the measuring instrument 20 to the optical fiber 12 by the FBG temperature sensor 12a and transmits the light to the measuring instrument 20 as light for measuring the strain of the substrate 11 due to the temperature change.

As illustrated in FIG. 4, the portion of the optical fiber 12 corresponding to the FBG temperature sensor 12a is covered with a cover member 15. The cover member 15 is a metal-made circular tube-shaped member having an inner diameter larger than the diameter of the optical fiber 12 and blocks stress from the substrate 11 to the FBG temperature sensor 12a by the optical fiber 12 being inserted thereinto. The cover member 15 is bonded to the bottom surface of the recess 11b corresponding to the FBG temperature sensor 12a by an adhesive 15a. The recess 11b corresponding to the FBG temperature sensor 12a has a shallower depth from the top surface of the substrate 11 than the other recesses 11b.

By covering a portion of the optical fiber 12 corresponding to the FBG temperature sensor 12a with the cover member 15, the change in the refractive index of the FBG temperature sensor 12a due to the stress from the substrate 11 is suppressed, and thus it becomes difficult for the FBG temperature sensor 12a to be affected by stress. As a result, according to the measuring device 1 according to the modification, the accuracy of detecting the temperature of the substrate 11 in the FBG temperature sensor 12a can be improved.

When one of the FBGs 12a is used as the FBG temperature sensor 12a, the strain amount of the substrate 11 detected by another FBG 12a may be compensated by using the temperature of the substrate 11 detected by the FBG temperature sensor 12a. In this case, the arithmetic device 25 of the measuring instrument 20 operates as follows.

The arithmetic device 25 calculates a temperature of the substrate 11 based on the reflected light reflected by the FBG temperature sensor 12a and received by the light receiver 24 (i.e., light intensity data). The arithmetic device 25 calculates a strain amount of the substrate 11 at the position corresponding to the other FBG 12a based on the reflected light reflected by the other FBG 12a and received by the light receiver 24 (i.e., light intensity data). Then, the arithmetic device 25 compensates for the calculated strain amount of the substrate 11 at the position corresponding to the other FBG 12a using the calculated temperature of the substrate 11. For example, the arithmetic device 25 holds in advance a correspondence relationship between a temperature of the substrate 11 and an error caused by a temperature change of the substrate 11. The arithmetic device 25 obtains an error based on the correspondence relationship and the temperature of the substrate 11 recorded in the recorder 30, and compensates for the calculated strain amount of the substrate 11 by subtracting the obtained error from the calculated strain amount of the substrate 11. This makes it possible for the measuring device 1 according to the modification to calculate the strain amount of the substrate 11 in which the error caused by the temperature change of the substrate 11 is canceled. Therefore, the attraction force distribution on the wafer held by the electrostatic chuck can be measured more appropriately.

In the above-described modification, the case in which one of the FBGs 12a is used as a temperature sensor is illustrated as an example, but two or more FBGs 12a may be used as the temperature sensor. In addition, a temperature distribution on the wafer held by the electrostatic chuck may be measured by obtaining the temperature distribution on the substrate 11 using all the FBGs 12a as temperature sensors.

As described above, the measuring jig according to an embodiment (e.g., the measuring jig 10) includes a substrate (e.g., the substrate 11) and an optical fiber (e.g., the optical fiber 12). The substrate is a substrate having substantially the same shape as a wafer for semiconductor manufacturing. The optical fiber includes therein reflection elements (e.g., the FBGs 12a) capable of reflecting light having a wavelength corresponding to the strain of the substrate due to stress. The optical fiber is fixed on one surface of the substrate in a state in which the reflection elements are disposed at plural positions, respectively, on the one surface of the substrate. Therefore, according to the present embodiment, it is possible to appropriately measure the attraction force distribution on the wafer that is held by the electrostatic chuck.

In the measuring jig according to an embodiment, the substrate may have one or more recesses (e.g., the recesses 11b) on the one surface. The reflection elements may be disposed at the positions of the one or more recesses, respectively, to be spaced apart from the bottom surfaces of the one or more recesses. Therefore, according to the present embodiment, it is possible to improve the accuracy of detecting the strain amount of the substrate in each reflection element.

The measuring jig according to an embodiment may further include a temperature sensor (e.g., the temperature sensor 13) provided on the one surface of the substrate. The temperature sensor may be provided adjacent to each reflection element. Therefore, according to the present embodiment, the temperature of the substrate used for compensating for the strain amount of the substrate can be measured with high accuracy by the temperature sensor.

In addition, in the measuring jig according to an embodiment, the optical fiber may be bonded to positions, where each reflection element is interposed therebetween, on the one surface of the substrate by an adhesive (e.g., the adhesive 14). The temperature sensor may be bonded to one of the positions, where each reflection element is interposed therebetween, on the one surface of the substrate by an adhesive that bonds the optical fiber. Therefore, according to the present embodiment, the temperature of the substrate used for compensating for the strain amount of the substrate can be measured with high accuracy by the temperature sensor.

In the measuring jig according to an embodiment, at least one reflection element (e.g., the FBG temperature sensor 12a) among the reflection elements may be used as a temperature sensor. In addition, the measuring jig may further include a cover member (e.g., the cover member 15) that covers a portion of the optical fiber corresponding to at least one reflection element used as the temperature sensor to block stress from the substrate to the at least one reflection element. Therefore, according to the present embodiment, it is possible to improve the accuracy of detecting the temperature of the substrate in the at least one reflection element used as a temperature sensor.

In the measuring jig according to an embodiment, the substrate may be formed of a resin having higher flexibility than silicon. Therefore, according to the present embodiment, the strain of the substrate due to stress can be easily generated, and thus it is possible to further improve the accuracy of detecting the strain amount of the substrate in each reflection element.

The measuring device according to an embodiment includes a measuring jig (e.g., the measuring jig 10), a light source (e.g., the light source 21), a light receiver (e.g., the light receiver 24), and an arithmetic part (e.g., the arithmetic device 25). The measuring jig includes a substrate (e.g., the substrate 11) and an optical fiber (e.g., the optical fiber 12). The substrate is a substrate having substantially the same shape as a wafer for semiconductor manufacturing. The optical fiber includes therein reflection elements (e.g., the FBGs 12a) capable of reflecting light having a wavelength corresponding to the strain of the substrate due to stress. The optical fiber is fixed on one surface of the substrate in a state in which the reflection elements are disposed at plural positions, respectively, on one surface of the substrate. The light source emits light to the optical fiber of the measuring jig in a state in which the measuring jig is held by an electrostatic chuck disposed in a chamber of a semiconductor manufacturing apparatus. The light receiver receives the light reflected by each of the reflection elements. The arithmetic part is configured to calculate a strain amount of the substrate at the positions on the one surface of the substrate based on the light received by the light receiver. Therefore, according to the present embodiment, it is possible to appropriately measure the attraction force distribution on the wafer that is held by the electrostatic chuck.

Here, it is also conceivable to detect a strain amount of a substrate using a strain gauge that detects a resistance value of a resistance element for an electric signal as a strain amount. However, when a strain amount of a substrate is detected using a strain gauge, the electrical characteristics of the strain gauge change due to radio frequency noise in the chamber of the semiconductor manufacturing apparatus and a voltage applied to the electrostatic chuck. Therefore, the accuracy of detecting the strain amount of the substrate is lowered. In contrast, according to the present embodiment, a strain amount on a substrate can be detected without using a strain gauge. As a result, according to the present embodiment, an attraction force distribution can be measured with high accuracy without being affected by radio frequency noise in a chamber of a semiconductor manufacturing apparatus and a voltage applied to an electrostatic chuck.

In addition, in the measuring device according to an embodiment, the measuring jig may further include a temperature sensor (e.g., the temperature sensor 13) provided on one surface of a substrate. The measuring device may further include a recorder configured to record the temperature of the substrate detected by the temperature sensor. Therefore, according to the present embodiment, the temperature of the substrate recorded in the recorder can be used to compensate for the strain amount of the substrate.

In addition, in the measuring device according to an embodiment, the arithmetic part may compensate for the calculated strain amounts of the substrate at the plural positions on one surface of the substrate using the temperature of the substrate recorded in the recorder. Therefore, according to the present embodiment, it is possible to calculate the strain amount of the substrate from which an error caused by the temperature change of the substrate is canceled. Therefore, an attraction force distribution on a wafer held by the electrostatic chuck can be measured more appropriately.

In the measuring device according to an embodiment, at least one reflection element (e.g., the FBG temperature sensor 12a) among the reflection elements may be used as a temperature sensor. The measuring jig may further include a cover member that covers a portion of the optical fiber corresponding to the at least one reflection element used as the temperature sensor to block stress from the substrate. Therefore, according to the present embodiment, it is possible to improve the accuracy of detecting the temperature of the substrate in the at least one reflection element used as a temperature sensor.

In addition, in the measuring device according to an embodiment, the arithmetic part may calculate the temperature of the substrate based on the light reflected by the at least one reflection element among the reflection elements and received by the light receiver. The arithmetic part may calculate the strain amount of the substrate at a position corresponding to the other reflection element based on light reflected by the other reflection element among the reflection elements and received by the light receiver. The arithmetic part may compensate for the calculated strain amount of the substrate at the position corresponding to the other reflection element using the calculated temperature of the substrate. Therefore, according to the present embodiment, it is possible to calculate the strain amount of the substrate from which an error caused by the temperature change of the substrate is canceled. Therefore, an attraction force distribution on a wafer held by the electrostatic chuck can be measured more appropriately.

Although embodiments have been described above, it should be considered that the embodiments disclosed herein are exemplary in all respects and are not restrictive. Indeed, the above-described embodiments can be implemented in various forms. In addition, the embodiments described above may be omitted, replaced, or modified in various forms without departing from the scope and spirit of the claims.

For example, in the above-described embodiments, the case in which the light source 21 of the measuring instrument 20 is a wavelength sweep type light source has been described as an example, but the disclosed technique is not limited thereto. The light source 21 may be a wideband type light source capable of emitting light including wavelength components. In this case, an optical spectrum analyzer may be used as the light receiver 24.

In addition, in the above-described embodiments, the case in which the recesses 11b are formed on the top surface of the substrate 11 has been described as an example, but the recesses 11b may be formed as a single continuous recess.

Furthermore, in the above-described embodiments, the case in which the measuring instrument 20 and the recorder 30 are different devices has been described as an example, but the measuring instrument 20 and the recorder 30 may be incorporated in a single device.

According to the present disclosure, an attraction force distribution on a wafer held by an electrostatic chuck can be appropriately measured.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A measuring jig comprising:
   a substrate configured to be held by an electrostatic chuck; and
   an optical fiber including therein reflection elements capable of reflecting light having a wavelength corresponding to strain of the substrate due to stress, and fixed to one surface of the substrate in a state in which the reflection elements are disposed at plural positions, respectively, on the one surface of the substrate,
   wherein the substrate includes recesses on the one surface, and
   wherein the reflection elements are disposed at positions of the recesses, respectively, to be spaced apart from bottom surfaces of the recesses.

2. The measuring jig of claim 1, further comprising:
   a temperature sensor provided on the one surface of the substrate.

3. The measuring jig of claim 2, wherein the temperature sensor is provided adjacent to each of the reflection elements.

4. The measuring jig of claim 3, wherein the optical fiber is bonded by an adhesive to positions, where each of the reflection elements is interposed therebetween, on the one surface of the substrate, and
   wherein the temperature sensor is bonded to one of the positions, where each of the reflection elements is interposed therebetween, on the one surface of the substrate by the adhesive that bonds the optical fiber.

5. The measuring jig of claim 4, wherein the substrate is formed of silicon or a resin having higher flexibility than silicon.

6. The measuring jig of claim 1, further comprising:
   a temperature sensor provided on the one surface of the substrate.

7. The measuring jig of claim 1, wherein at least one of the reflection elements is used as a temperature sensor, and
   wherein the measuring jig further comprises a cover member that covers a portion of the optical fiber corresponding to the at least one reflection element used as the temperature sensor to block stress from the substrate to the at least one reflection element.

8. The measuring jig of claim 1, wherein the substrate is formed of silicon or a resin having higher flexibility than silicon.

9. A measuring device comprising:
   a measuring jig including a substrate configured to be held by an electrostatic chuck, and an optical fiber including therein reflection elements capable of reflecting light having a wavelength corresponding to strain of the substrate due to stress, wherein the optical fiber is fixed to one surface of the substrate in a state in which the reflection elements are disposed at plural positions, respectively, on the one surface of the substrate;
- a light source configured to emit light to the optical fiber of the measuring jig in a state in which the measuring jig is held by the electrostatic chuck disposed in a chamber of a semiconductor manufacturing apparatus;
- a light receiver configured to receive light reflected by each of the reflection elements; and
- an arithmetic part configured to calculate a strain amount of the substrate at the plural positions on the one surface of the substrate based on the light received by the light receiver,
- wherein the substrate includes recesses on the one surface, and
- wherein the reflection elements are disposed at positions of the recesses, respectively, to be spaced apart from bottom surfaces of the recesses.

10. The measuring device of claim 9, wherein the measuring jig further includes a temperature sensor provided on the one surface of the substrate, and
- wherein the measuring device further includes a recorder configured to record a temperature of the substrate detected by the temperature sensor.

11. The measuring device of claim 10, wherein the arithmetic part is further configured to compensate for the calculated strain amount of the substrate at the plural positions on the one surface of the substrate using the temperature of the substrate recorded in the recorder.

12. The measuring device of claim 9, wherein at least one of the reflection elements is used as a temperature sensor, and
- wherein the measuring jig further includes a cover member that covers a portion of the optical fiber corresponding to the at least one reflection element used as the temperature sensor to block stress from the substrate.

13. The measuring device of claim 12, wherein the arithmetic part is configured to:
- calculate a temperature of the substrate based on the light reflected from the at least one reflection element among the reflection elements and received by the light receiver;
- calculate, based on light reflected from the other reflection element among the reflection elements and received by the light receiver, a strain amount of the substrate at a position corresponding to the other reflection element; and
- compensate for the calculated strain amount of the substrate at the position corresponding to the other reflection element using the calculated temperature of the substrate.

* * * * *